US008188445B2

(12) United States Patent
Godet et al.

(10) Patent No.: US 8,188,445 B2
(45) Date of Patent: May 29, 2012

(54) ION SOURCE

(75) Inventors: Ludovic Godet, Boston, MA (US);
Timothy J. Miller, Ipswich, MA (US);
Joseph C. Olson, Beverly, MA (US);
Vikram Singh, North Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 127 days.

(21) Appl. No.: 12/848,354

(22) Filed: Aug. 2, 2010

(65) Prior Publication Data
US 2011/0186749 A1    Aug. 4, 2011

Related U.S. Application Data

(63) Continuation-in-part of application No. 12/417,929, filed on Apr. 3, 2009, now Pat. No. 7,767,977.

(51) Int. Cl.
*H01J 49/10* (2006.01)
*H01J 37/08* (2006.01)
*H01J 23/06* (2006.01)

(52) U.S. Cl. ............... 250/423 R; 250/424; 250/426; 250/492.3; 315/111.81; 315/111.21; 313/363.1; 438/961

(58) Field of Classification Search ........... 250/423 R, 250/424, 426, 492.3; 315/111.81, 111.21; 313/363.1; 438/961
See application file for complete search history.

(56) References Cited

U.S. PATENT DOCUMENTS

| 5,107,170 | A | 4/1992 | Ishikawa et al. | |
|---|---|---|---|---|
| 5,954,887 | A | 9/1999 | Hatano | |
| 6,647,993 | B2 | 11/2003 | Shang et al. | |
| 6,730,197 | B2 | 5/2004 | Wang et al. | |
| 6,803,590 | B2 | 10/2004 | Brailove et al. | |
| 7,564,042 | B2 * | 7/2009 | Lee et al. | 250/396 R |
| 7,767,977 | B1 * | 8/2010 | Godet et al. | 250/423 R |
| 7,838,850 | B2 * | 11/2010 | Hahto et al. | 250/492.21 |
| 2001/0042827 | A1 | 11/2001 | Fang et al. | |
| 2003/0141831 | A1 | 7/2003 | Chen | |
| 2004/0251424 | A1 | 12/2004 | Murata et al. | |
| 2008/0067430 | A1 | 3/2008 | Hershkowitz et al. | |
| 2008/0132046 | A1 | 6/2008 | Walther | |
| 2008/0179546 | A1 | 7/2008 | Lee et al. | |
| 2008/0242065 | A1 | 10/2008 | Brcka | |
| 2009/0061605 | A1 | 3/2009 | Godet et al. | |
| 2009/0084987 | A1 | 4/2009 | Godet et al. | |

FOREIGN PATENT DOCUMENTS

| JP | 8138595 A | 5/1996 |
|---|---|---|
| JP | 2006054334 A | 2/2006 |
| JP | 2006278006 A | 10/2006 |
| JP | 2007273368 A | 10/2007 |
| KR | 10200000033006 A | 6/2000 |
| WO | 2010040805 A1 | 4/2010 |

* cited by examiner

*Primary Examiner* — Nikita Wells

(57) ABSTRACT

An ion source includes an arc chamber having an extraction aperture, and a plasma sheath modulator positioned in the arc chamber. The plasma sheath modulator is configured to control a shape of a boundary between a plasma and a plasma sheath proximate the extraction aperture, wherein the plasma sheath modulator includes a semiconductor. A well focused ion beam having a high current density can be generated by the ion source. A high current density ion beam can improve the throughput of an associated process. The emittance of the ion beam can also be controlled.

19 Claims, 8 Drawing Sheets

ION SOURCE

CROSS REFERENCE TO RELATED APPLICATIONS

This application is related to U.S. application Ser. No. 12/418,120 filed Apr. 3, 2010, which is incorporated herein by reference.

This application is also a continuation-in-part of U.S. application Ser. No. 12/417,929, filed Apr. 3, 2009, which is incorporated herein by reference.

FIELD

This disclosure relates to ion sources, and more particularly to an ion source having a plasma sheath modulator.

BACKGROUND

An ion source is a critical component of an ion implanter and other processing equipment. The ion source generally includes an arc chamber which accepts a feed gas. The feed gas is ionized in the arc chamber by differing techniques known in the art to generate plasma. The plasma is generally a quasi-neutral collection of ions (usually having a positive charge) and electrons (having a negative charge). The plasma has an electric field of about 0 volts per centimeter in the bulk of the plasma. The plasma is bounded by a region generally referred to as a plasma sheath. The plasma sheath is a region that has fewer electrons than the plasma. The light emission from this plasma sheath is less intense than the plasma since fewer electrons are present and hence few excitation-relaxation collisions occur. Hence, the plasma sheath is sometimes referred to as "dark space."

Turning to FIG. 1, a cross sectional view of a known ion source 100 is illustrated having an arc chamber 102. The arc chamber 102 includes a sidewall 103 having an extraction aperture 110. A feed gas (not illustrated) is ionized in the arc chamber 102 to generate plasma 140 having a plasma sheath 142 proximate the extraction aperture 110. The boundary 141 between the plasma 140 and the plasma sheath 142 proximate the extraction aperture is generally parallel to a plane 132 defined by an interior surface of the sidewall 103 depending on the plasma density of the plasma 140 and the electric field generated by an extraction electrode assembly (not illustrated). Ions 106 are extracted by the extraction electrode assembly into a well-defined ion beam 118.

One drawback with this conventional ion source is the lack of ion beam to focusing originating from the extraction aperture 110. Ions 106 are accelerated across the plasma sheath 142 at about right angles to the boundary 141 between the plasma 140 and the plasma sheath 142. Since the boundary 141 is generally parallel to the plane 132, there is little angular spread control of the ions 106 that form the ion beam 118. Another drawback with this conventional ion source is the shape of the boundary 141 limits the number of ions 106 that can be accelerated across the same through the extraction aperture 110. This can limit the ion beam current density achievable from the ion source. Ion beam current density is a beam current value per unit area typically expressed in milliamperes per square centimeters ($mA/cm^2$). A relatively higher beam current density is desirable in some instances and can improve the throughput performance of a given process. Yet another drawback with a conventional ion source is that the shape of the boundary 141 is determined by the plasma density of the plasma 140 and the strength of the electric field. For example, for a given plasma density, a high extraction electric field may cause a concave boundary. A decrease in plasma density may cause a convex boundary. All these facts limit emittance control of the ion beam from the conventional ion source. The emittance of an ion beam is generally spatial and angular distributions of the ion beam, and can also be defined roughly as the product of beam diameter and angular spread in transverse momentum at each point.

Accordingly, there is a need for an ion source which overcomes the above-described inadequacies and shortcomings.

SUMMARY

According to a first aspect of the disclosure, an ion source is provided. The ion source includes an arc chamber having an extraction aperture, and a plasma sheath modulator positioned in the arc chamber. The plasma sheath modulator is configured to control a shape of a boundary between a plasma and a plasma sheath proximate the extraction aperture, wherein the plasma sheath modulator includes a semiconductor.

According to another aspect of the disclosure, a method is provided. The method includes generating a plasma in an arc chamber of an ion source having an extraction aperture, extracting ions from the plasma into an ion beam during ON time intervals of a pulsed bias signal, and controlling a shape of a boundary between the plasma and a plasma sheath proximate the extraction aperture during the ON time intervals

BRIEF DESCRIPTION OF THE DRAWINGS

For a better understanding of the present disclosure, reference is made to the accompanying drawings, in which like elements are referenced with like numerals, and in which.

DETAILED DESCRIPTION

The present invention will now be described more fully hereinafter with reference to the accompanying drawings, in which embodiments of the invention are shown. The invention, however, may be embodied in many different forms and should not be construed as limited to the embodiments set forth herein.

Figure 1:
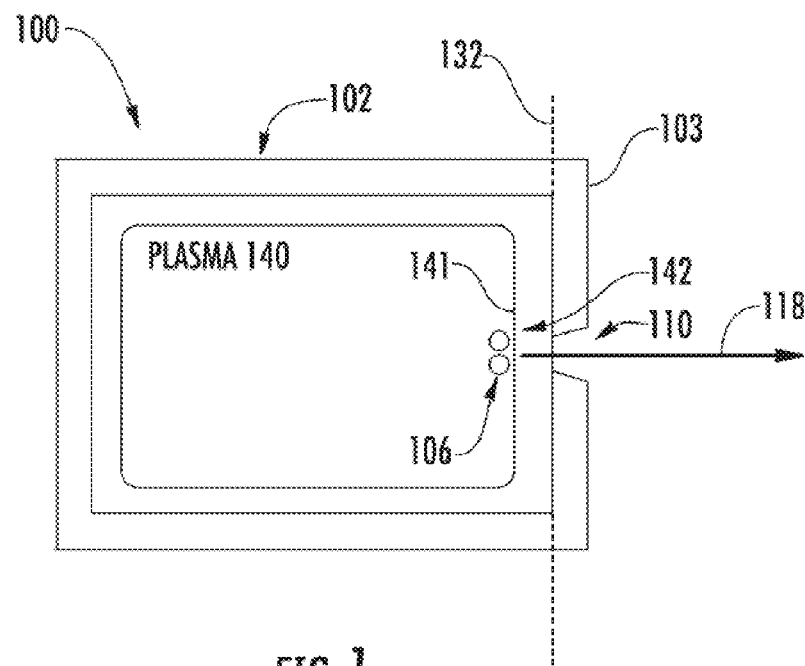
FIG. 1 is a cross sectional view of a conventional ion source consistent with the prior art.
Figure 2:
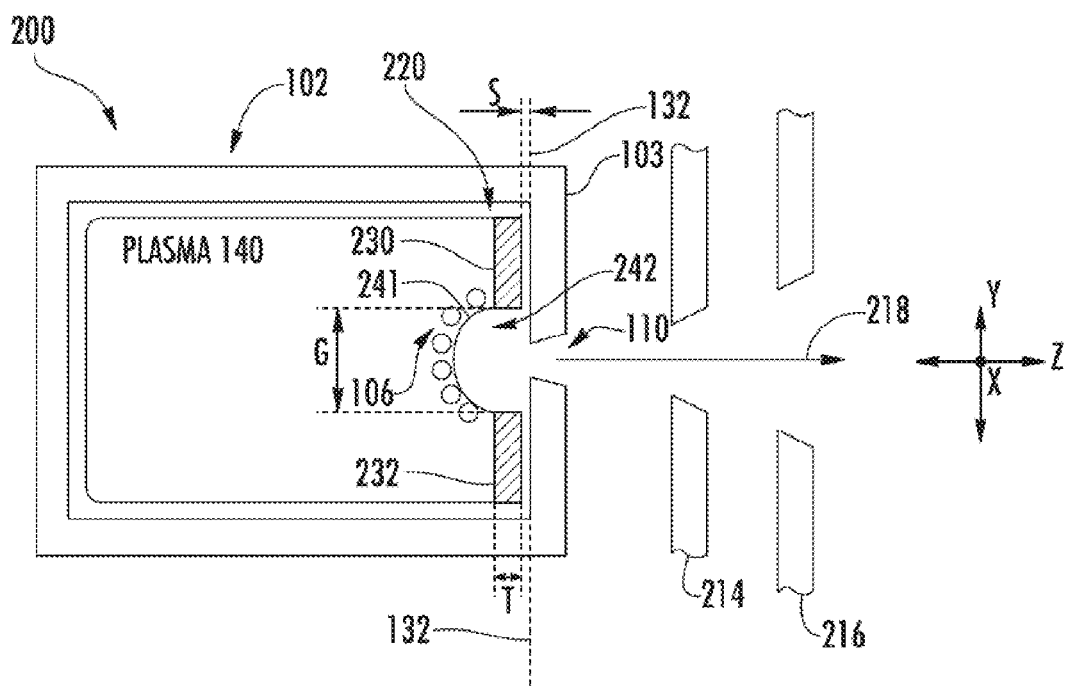
FIG. 2 is a cross sectional view of an ion source consistent with an embodiment of the disclosure.

Turning to FIG. 2, a cross sectional view of an ion source 200 consistent with an embodiment of the disclosure is illustrated. The ion source 200 includes an arc chamber 102 having a sidewall 103 with an extraction aperture 110. The ion source 200 further includes a plasma sheath modulator 220 to control a shape of a boundary 241 between the plasma 140 and the plasma sheath 242 proximate the extraction aperture 110. An extraction electrode assembly extracts ions 106 from the plasma 140 and accelerates them across the plasma sheath 242 to a desired extraction energy of a well-defined ion beam 218. The extraction electrode assembly may include the sidewall 103 functioning as an arc slot electrode, a suppression electrode 214 and a ground electrode 216. The suppression electrode 214 and the ground electrode 216 each have an aperture aligned with the extraction aperture 110 for extraction of the well-defined ion beam 218. To aid with explanation, a Cartesian coordinate system is defined where the ion beam 218 travels in the Z direction. The X-Y plane is perpendicular to the Z direction which can change depending on the direction of the ion beam.

In the embodiment of FIG. 2, the plasma sheath modulator 220 includes a pair of insulators 230, 232 positioned in the arc chamber 102. In other embodiments, the modulator may include only one insulator. The insulators 230, 232 may be fabricated of quartz, alumina, boron nitride, glass, porcelain, silicon nitride, etc. The pair of insulators 230, 232 may be a pair of sheets having a thin, flat shape. In other embodiments, the pair of insulators 230, 232 may be other shapes such as tube shaped, wedge shaped, and/or have a beveled edge. The pair of insulators 230, 232 defines a gap there between having spacing (G). The pair of insulators 230, 232 may also be positioned a vertical spacing (S) above the plane 132 defined by an interior surface of the sidewall 103 having the extraction aperture 110.

In operation, a feed gas (not illustrated) is supplied to the arc chamber 102. Examples of a feed gas include, but are not limited to, $BF_3$, $PH_3$, $AsH_3$, $B_2H_6$, He, $H_2$, Ar, and $GeH_4$. The feed gas may originate from a gas source or may be vaporized from a solid source depending on the desired species. The feed gas is ionized in the arc chamber 102 to generate plasma 140. Those skilled in the art will recognize differing types of ion sources that generate plasma in differing ways such as, e.g., an indirectly heated cathode (IHC) source, a Bernas source, a RF source, a microwave source, and an electron cyclotron resonance (ECR) source. An IHC source generally includes a filament positioned in close proximity to a cathode, and also includes associated power supplies. The cathode (not illustrated) is positioned in the arc chamber 102. As the filament is heated, electrons emitted by the filament are accelerated towards the cathode to provide for heating of the cathode. The heated cathode, in turn, provides electrons into the arc chamber that have ionizing collisions with the gas molecules of the feed gas to generate plasma.

An extraction electrode assembly including the sidewall 103, the suppression electrode 214, and the ground electrode 216 extracts ions 106 from the plasma 140 in the arc chamber 102 into the well-defined ion beam 218. The ions 106 are accelerated across the boundary 241 and the plasma sheath 242 through the gap between the pair of insulators 230, 232. The sidewall 103 functioning as an arc source electrode may be biased by a power supply to the same large potential as the arc chamber 102. The suppression electrode 214 may be biased at a moderately negative value to prevent electrons from entering back into the arc chamber 102. The ground electrode 215 may be at ground potential. The strength of the electric field generated by the electrode assembly may be tuned to achieve a desired beam current and energy.

Advantageously, the plasma sheath modulator 220 controls a shape of the to boundary 241 between the plasma 140 and the plasma sheath 242 proximate the extraction aperture 110. To control the shape of the boundary 241 the plasma sheath modulator 220 modifies or influences the electric field within the plasma sheath 242. When the plasma sheath modulator 220 includes the pair of insulators 230, 232, the boundary 241 may have a concave shape relative to the plasma 140 as illustrated in FIG. 2. Depending on a number of factors including, but not limited to, the horizontal spacing (G) between the insulators 230, 232, the vertical spacing (S) of the insulators above the plane 132, the insulator material including its dielectric constant, the thickness (T) of the insulators 230, 232, and other process parameters of the ion source, the shape of the boundary 241 can be controlled.

The shape of the boundary 241 between the plasma 140 and the plasma sheath 242 together with the electric field gradients within the plasma sheath 242 control parameters of the ion beam. For example, the angular spread of the ions 106 can be controlled to assist with ion beam focusing. For instance, with the boundary 241 having a concave shape relative to the plasma, there is a large angular spread of ions accelerated across the boundary to assist with beam focusing. In addition, the ion beam current density of the ion beam 218 can also be controlled. For example, compared to the boundary 141 of one conventional ion source, the boundary 241 has a larger area to extract additional ions. Hence, the additional extracted ions contribute to an increased ion beam current density. Accordingly, with all other parameters being equal, the shape of the boundary 241 can provide a focused ion beam with a high ion beam current density. Furthermore, the emittance of the ion beam can also be controlled by controlling the shape of the boundary 241. Consequently, the beam quality of the extracted ion beam can be well defined for a given particle density and angular distribution.

Figure 3:
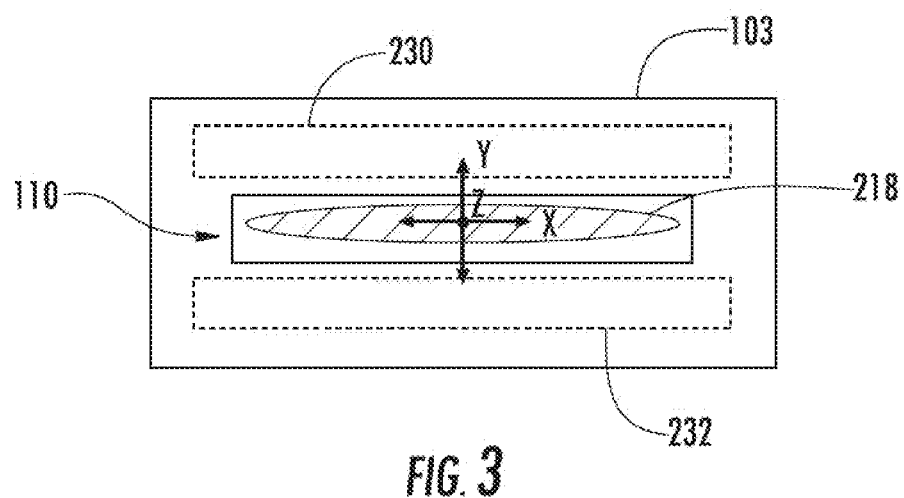
FIG. 3 is a view of one embodiment of the sidewall of the arc chamber of FIG. 2.

Turning to FIG. 3, a view of one embodiment of the sidewall 103 and extraction aperture 110 is illustrated looking upstream in the Z direction so the ion beam 218 is coming out of the page. As shown, the extraction aperture 110 may have an elongated rectangular shape to permit extraction of the ion beam 218. In this instance, the ion beam 218 has a long dimension in the X direction at least a is few times greater than its width in the Y direction. This type of beam is referred to in the art as a "ribbon beam." Although shown with its long dimension oriented in the X direction, the long dimension may be oriented in any desired direction, e.g., the long dimension of the ribbon beam may be in the Y direction or any other angle relative to the X and Y directions. The insulators 230, 232 are shown in phantom and may have a rectangular sheet shape as illustrated to control the shape of the boundary 241 between the plasma 140 and the plasma sheath 242.

Figure 4:
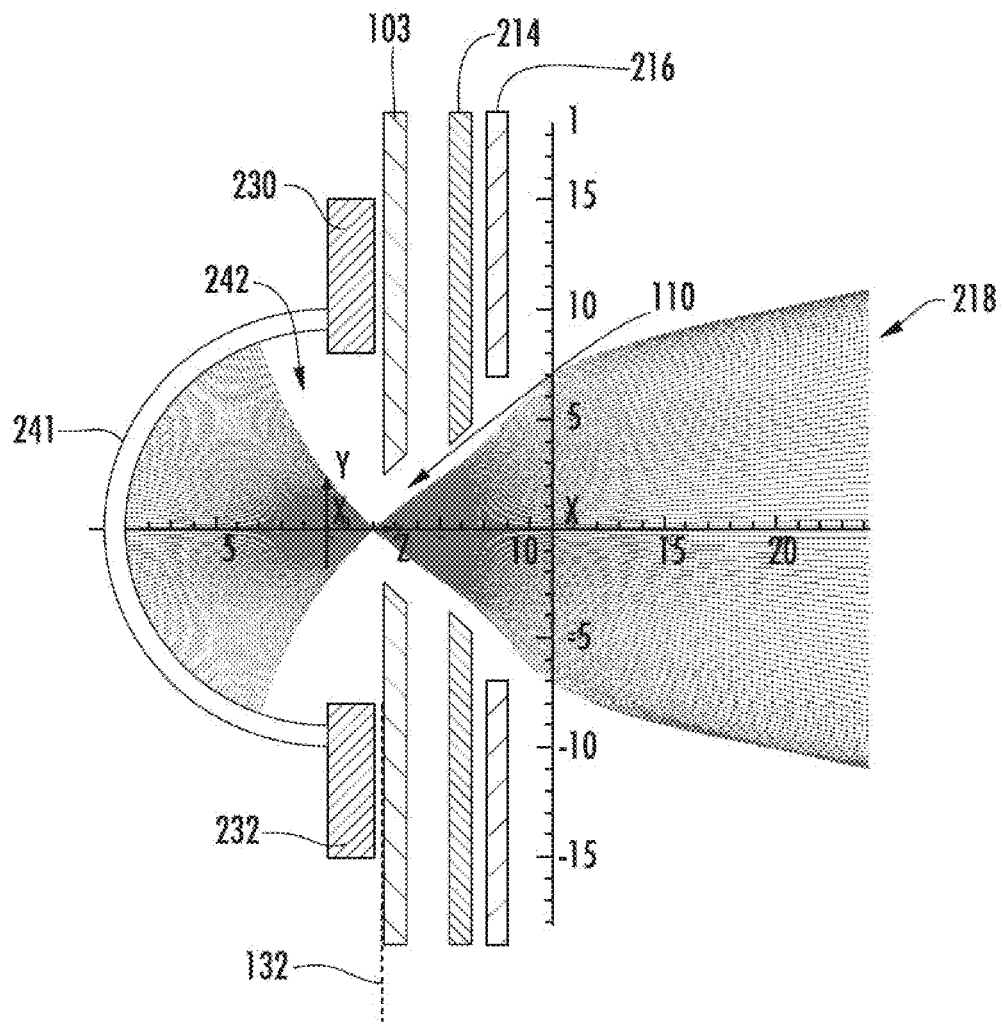
FIG. 4 is a cross sectional view consistent with FIG. 2 illustrating trajectories of ions accelerated across the boundary of FIG. 2.

FIG. 4 is a partial cross sectional view of the pair of insulators 230, 232 and extraction electrode assembly consistent with FIG. 2 illustrating simulated ion trajectories accelerated across the boundary 241 and the plasma sheath 242. The ions are accelerated through the gap defined by the pair of insulators 230, 232 and extracted through the extraction aperture 110. Given the shape of the boundary 241 and electric field gradient within the plasma sheath 242, a large angular spread of ion trajectories may be achieved which can assist with ion beam focusing. In addition, the shape of the boundary 241 enables a relatively larger number of ions to be extracted compared to a boundary shape parallel to the plane 132. Accordingly, ion beam current density of the ion beam extracted from the ion source assembly can be increased and controlled. Beam emittance and angular spread of the ions can also be controlled.

Figure 5:
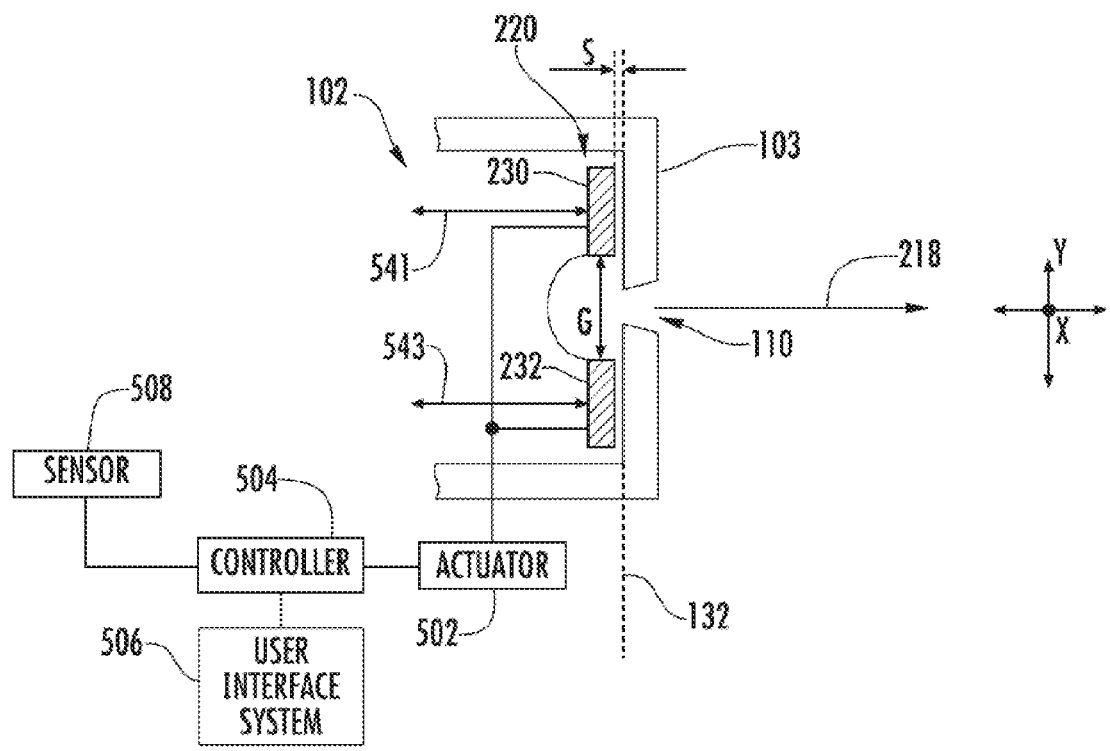
FIG. 5 is a block diagram of a system to control spacing of a plasma sheath modulator.

Turning to FIG. 5, a block diagram of another embodiment consistent with the present disclosure is illustrated where the position of the plasma sheath modulator 220 may be modified and set to a desired position. The plasma sheath modulator 220 may be the pair of insulators 230, 232 and the spacing of the gap (G) between the insulators in the Y direction may be adjusted. The spacing (S) of the insulators 230, 232 in the Z direction from the plane 132 defined by the interior surface of the sidewall 103 may also be adjusted. By adjusting the position of the insulators 230, 232 the shape of the boundary 241 between the plasma and the plasma sheath may be modified. Accordingly, ion beam focusing, ion beam current density, and emittance of the ion beam may also be controlled.

To set a desired position of the insulators 230, 232, the system of FIG. 5 may also include an actuator 502, a controller 504, a user interface system 506, and a sensor 508. The actuator 502 may be mechanically coupled to the insulators 230, 232 to drive them in differing directions, e.g., in the Z direction as illustrated by arrows 541, 543 to control the spacing (S) and/or in the Y direction to control the gap (G) spacing. The controller 504 can be or include a general-purpose computer or network of general-purpose computers that may be programmed to perform desired input/output functions. The controller 504 may also include communication devices, data storage devices, and software. The user interface system 506 may include devices such as touch screens, keyboards, user pointing devices, displays, printers, etc. to allow a user to input commands and/or data and/or to monitor the system. The sensor 508 may include a Faraday sensor to sense beam current of the ion beam as is known in the art. The sensor 508 may also include a beam angle sensor to measure an angle of the beam at a particular position. Differing beam angle sensors are known in the art and one could include a shield positioned upstream one or more Faraday cups. The shield is moved across the ion beam to block different portions of the beam as it is moved relative to the downstream Faraday cup(s). The beam current readings together with the to known position of the shield and Faraday cup(s) may be used to determine beam angles.

In operation, the controller 504 may be responsive to a desired ion beam current density and/or beam focusing value and/or emittance value set by a user via the user interface system 506. The controller 504 may instruct the actuator 502 to position the insulators 320, 322 in a desired position to achieve a desired boundary 241 shape. The controller 504 may also be responsive to sensed conditions from the sensor 508 to update and modify the position of the insulators 230, 232 based on sensed conditions such as beam current and/or beam angle measurements and/or beam emittance.

Figure 6:
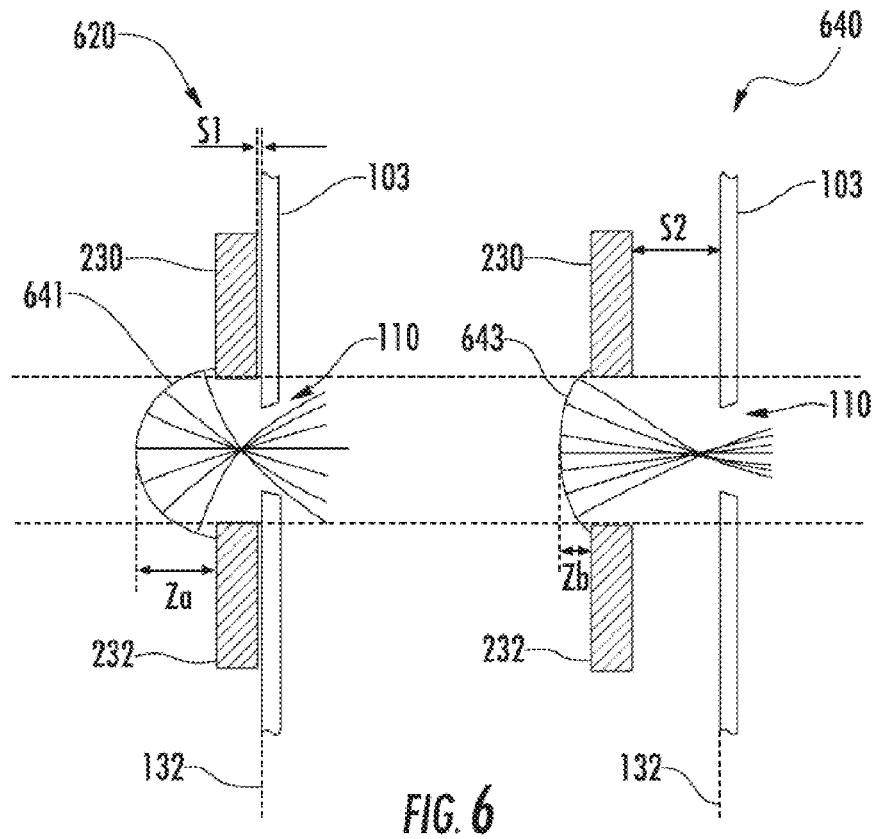
FIG. 6 is a partial cross sectional view illustrating ion trajectories at different vertical positions of the plasma sheath modulator of FIG. 5.

FIG. 6 is a cross sectional view consistent with FIG. 5 to illustrate ion trajectories at differing (S) positions of the pair of insulators 230, 232 relative to the plane 132 with all other parameters being equal. In the first shorter position 620, the insulators 230, 232 are positioned a first distance (S1) above the plane 132. In a comparatively taller position 640, the insulators 230, 232 are positioned a second distance (S2) above the plane 132, where (S2)>(S1). In the first position 620, the boundary 641 between the plasma and the plasma sheath has a concave shape. The boundary 841 also has a shape that approximately approaches the shape of a portion of a circumference of a circle where an apex of the arcuate shape is a distance (Za) above a top surface of the insulator 232. In contrast, the boundary 643 in the second position 640 has a shallower shape where the apex of the arcuate shape is a shorter distance (Zb) above the top surface of the insulator 232, or where (Zb)<(Za).

The shape of the boundaries 641, 643 and the electric field lines in the plasma sheath, influences the angular spread of the ions extracted from the ion source, the ion beam current density of the ion beam, and the emittance of the ion beam. For example, the angular spread of ions with the relatively shorter (S1) spacing 620 is greater than the angular spread of the ions with the relatively longer (S2) spacing 640. In addition, the ion beam current density of the ion beam of the shorter spacing 620 is greater than that of the taller spacing 640 with all other parameters being equal given the increased extraction area for the ions. Although not illustrated in FIG. 6, the spacing (S) positions of each insulator 230, 232 relative to the plane 132 may also be different from each other to further influence the shape of the boundary between the plasma and the plasma sheath.

Figure 7:
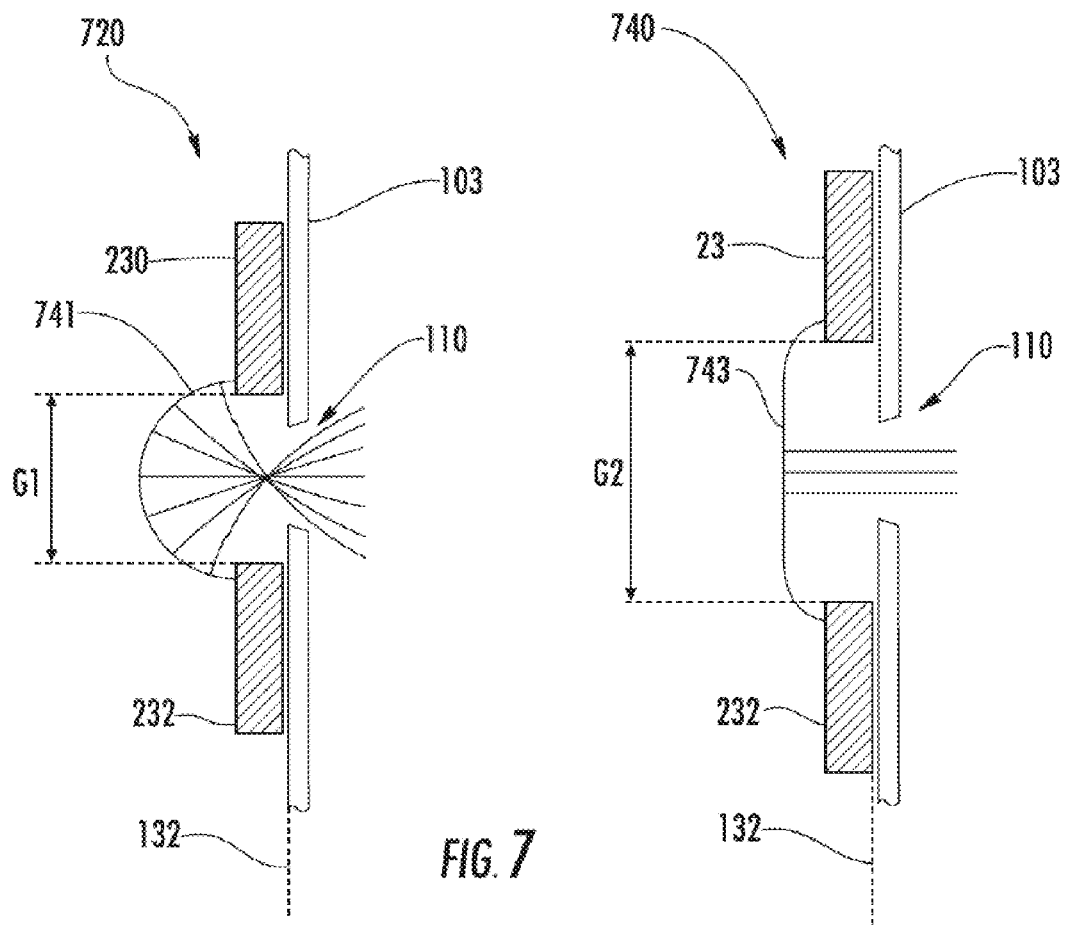
FIG. 7 is a partial cross sectional view illustrating ion trajectories at different horizontal gap positions of the plasma sheath modulator of FIG. 5.

FIG. 7 is a cross sectional view consistent with FIG. 5 to illustrate ion trajectories at differing gap spacing between the insulators 230, 232 with all other parameters being equal. In the first relatively shorter gap position 720, the insulators 230, 232 are positioned a first distance (G1) from one another. In a comparatively longer gap position 740, the insulators 230, 232 are positioned a second distance (G2) from each other, where (G2)>(G1). In the first position 720, the boundary 741 between the plasma and the plasma sheath has a concave shape. The boundary 741 also has a shape that approximately approaches the shape of a portion of a circumference of a circle. In contrast, the boundary 743 in the second position 740 has a concave shape where a central portion of the boundary 743 is about parallel to the plane 132. The angular spread of ions from the shorter gap position 720 provides for a comparatively larger angular spread of ions than that of the longer gap position 740. In addition, the ion beam current density form the shorter gap position 720 is comparatively larger than that of the longer gap position 740 with all other parameters being equal given the larger area of the boundary 741 from which ions are extracted.

Figure 8:
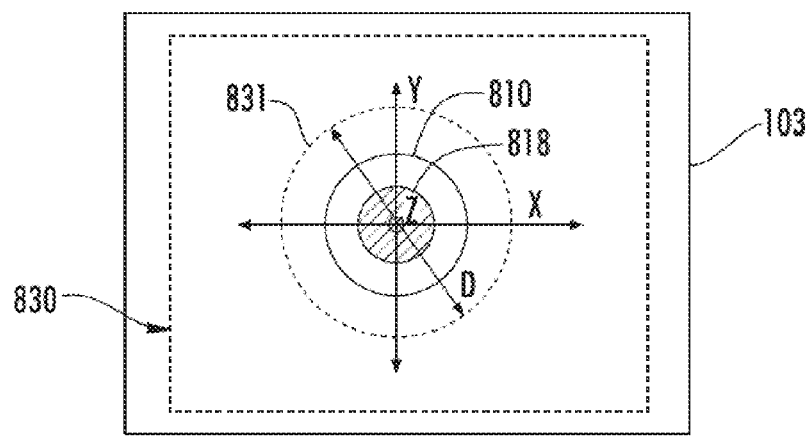
FIG. 8 is a view of another embodiment of a sidewall of an arc chamber of an ion source consistent with the disclosure.

Turning to FIG. 8, a view of another embodiment of a sidewall 103 having a circular shaped extraction aperture 810 is illustrated looking upstream in the Z direction so the ion beam 818 is coming out of the page. In this embodiment, the ion beam 818 has an approximately circular cross sectional shape and may be referred to in the art as a "spot" beam. Although illustrated as having an approximately circular cross sectional shape, the "spot" beam typically has an irregular shape. The plasma sheath modulator 830 shown in phantom in this embodiment may be an insulator having a thin rectangular sheet shape with a circular opening 831. Furthermore, the circular opening 831 may be concentric with the circular extraction aperture 810. In addition, the diameter (D) of the circular opening 831 may be variable to control the shape of the plasma sheath and boundary between the plasma sheath and plasma. The variable diameter (D) may be set in response to different parameters including a desired ion beam current density of the ion beam 818.

Figure 9:
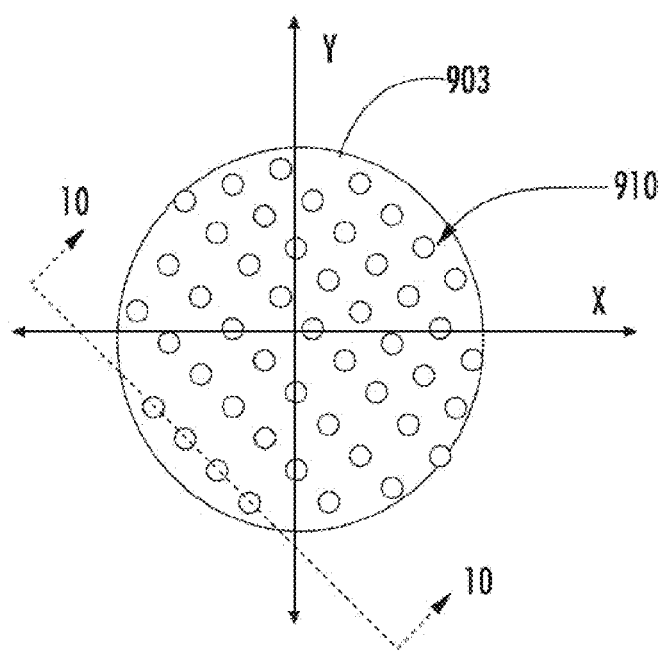
FIG. 9 is a view of another embodiment of a sidewall of an arc chamber of an ion source consistent with the disclosure having a plurality of apertures.
Figure 10:
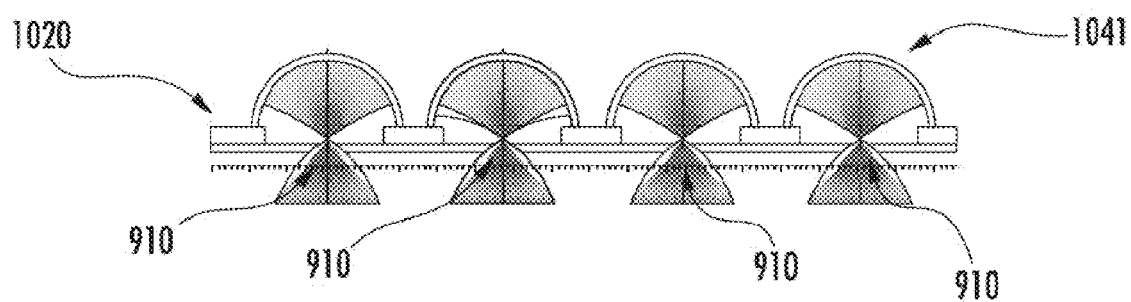
FIG. 10 is a cross sectional view taken along the lines 10-10 of FIG. 9.

Turning to FIG. 9, a view of another embodiment of a sidewall 903 of an associated arc chamber of an ion source is illustrated looking upstream in the Z direction. The sidewall 903 has a plurality of circular extraction apertures 910. FIG. 10 is a cross sectional view taken along the lines 10-10 of FIG. 9 illustrating a plasma sheath modulator 1020 and a corresponding boundary 1041 between a plasma and the plasma sheath. Ion trajectories of ions accelerated across the boundary 1041 are also illustrated.

Accordingly, there is provided an ion source having a plasma sheath modulator configured to control a shape of a boundary between the plasma and plasma sheath proximate the extraction aperture. This enables better control of ion beam focusing as the angular spread of ions accelerated across the boundary and the plasma sheath can be better controlled. In addition, the ion beam current density of the ion beam extracted from the ion source assembly can also be controlled. Furthermore, the emittance of the ion beam can also be controlled. A high ion beam current density may be achieved by increasing the effective area from which ions are extracted to form the ion beam. A high ion beam current density can improve the throughput of an associated process.

Figure 11:
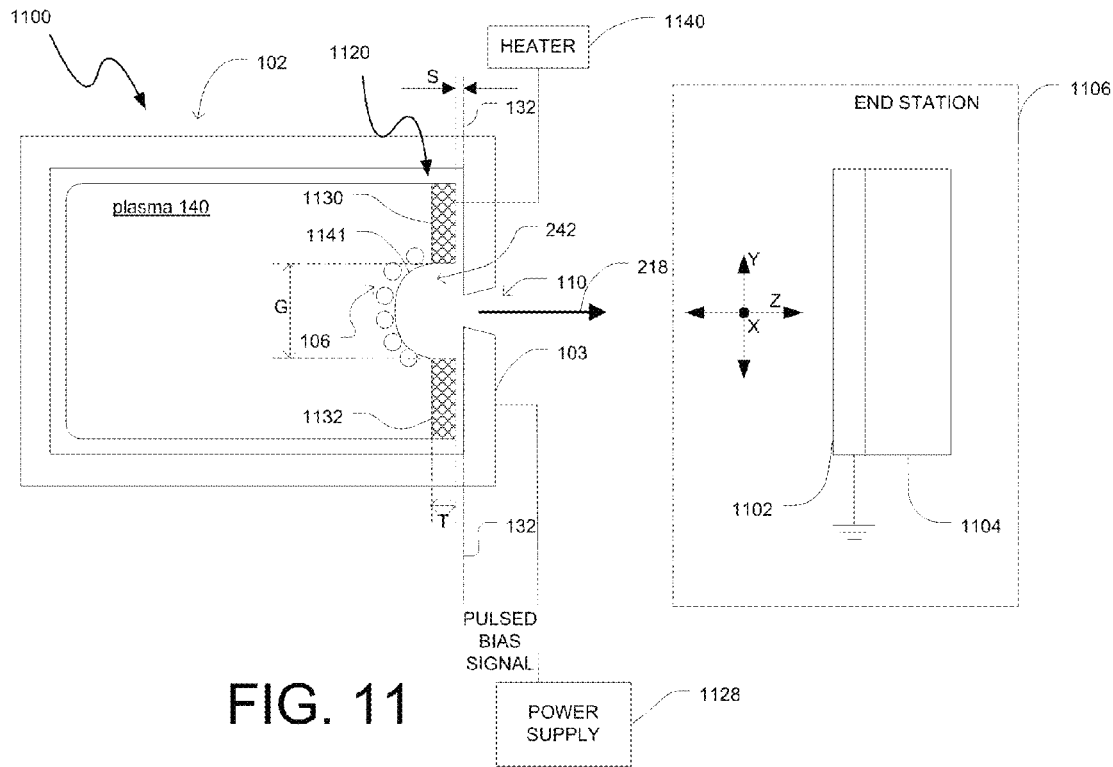
FIG. 11 is a cross sectional view of an ion source consistent with another embodiment of the disclosure.

Turning to FIG. 11, a cross sectional view of an ion source 1100 consistent with another embodiment of the disclosure is illustrated. Compared to previous embodiments, like reference numerals of FIG. 11 refer to like parts and hence any repetitive description is omitted herein for clarity. The ion source 1100 includes a plasma sheath modulator 1120 to control a shape of the boundary 1141 between the plasma 140 and the plasma sheath 242 proximate the extraction aperture 110 when ions are extracted from the arc chamber 102 of the ion source 1100. The plasma sheath modulator 1120 includes a pair of semiconductors 1130, 1132 defining a gap there between. Other embodiments may have multiple pairs of semiconductors defining multiple gaps. In addition, previous embodiments detailed in FIGS. 2-10 may also have a plasma sheath modulator fabricated of semiconductor material.

The semiconductors 1130, 1132 may be fabricated of semiconductor materials, including, but not limited to, silicon, germanium, silicon carbide, silicon germanium, aluminum antimonide, aluminum nitride, and gallium arsenide. The semiconductors 1130, 1132 may also be fabricated of doped semiconductor materials including, for example, doped silicon and doped silicon carbide. To form the doped silicon carbide, silicon carbide may be doped with species such as nitrogen, boron, and aluminum to name only several dopants.

The pair of semiconductors 1130, 1132 may also be a pair of sheets having a thin, flat shape. The pair of semiconductors 1130, 1132 defines a gap there between having spacing (G). The pair of semiconductors 1130, 1132 may also be positioned a vertical spacing (S) above the plane 132 defined by an interior surface of the sidewall 103.

A heater 1140 may provide heat to the pair of semiconductors 1130, 1132 although for clarity of illustration is shown as providing heat to only one semiconductor 1130. The heater 1140 is also illustrated as being outside of the arc chamber 102 but depending on the type of heater may also be positioned inside the arc chamber. In one instance, the heater may be resistive coils positioned between the pair of semiconductors 1130, 1132 and the interior surface of the sidewall 103 to protect the resistive coils from the plasma 140. In other instances, the heater may include differing liquids or gases.

Depending on a number of factors including, but not limited to, the horizontal spacing (G) between the pair of semiconductors 1130, 1132, the vertical spacing (S) of the semiconductors above the plane 132, a difference in vertical spacing between each semiconductor 1130, 1132 above the plane, the semiconductors material including its relative conductivity, the thickness (T) of the semiconductors 1130, 1132, the temperature of the pair of semiconductors 1130, 1132, and other process parameters of the ion source, the shape of the boundary 1141 can be controlled.

The ion source 1100 may be a component of an ion implanter having an end station 1106 positioned downstream of the ion source 1100 in direction of travel of the ion beam 218. The end station 1106 may be positioned in close proximity (e.g., in one embodiment less than 12 inches) to the extraction aperture 110 of the ion source thereby creating a relatively short distance for the ion beam 218 to travel compared to other ion implanters with many beam line components. The end station 1106 may include a platen 1104 to support a workpiece 1102. The platen 1104 may be an electrostatic platen to secure the workpiece 1102 with electrostatic forces as is known in the art. The workpiece 1102 may include, but not be limited to, a solar cell, flat panel, magnetic media, semiconductor wafer, etc. The ion beam may 218 be distributed across the front surface of the workpiece by ion beam movement, workpiece movement, or a combination of the two. The workpiece may also be rotated between process steps. In one embodiment, the ion source 1100 may generate a ribbon beam and the workpiece 1102 may be driven in a direction orthogonal to the long dimension of the ribbon beam to treat an entirety of the front surface of the workpiece with the ribbon beam. The entire path traversed by the ion beam 218 may be pumped to a vacuum condition during ion treatment.

An extraction electrode assembly including the sidewall 103 functioning as an arc source electrode may be biased by a power supply 1128 to create forces to extract the ions 106 from the extraction aperture 110 into a well defined ion beam 218 as illustrated in FIG. 11 while the workpiece 1102 is grounded. Alternatively, given the proximity of the workpiece 1102 to the extraction aperture 110, the workpiece 1102 may be biased and the sidewall 103 grounded. Regardless of the bias scheme, the bias signal may be a pulsed bias signal having ON and OFF time interval so that ions are extracted during the ON intervals but not the OFF intervals. One reason for a pulsed bias signal is to control the amount of charge accumulation on the workpiece 1102 to acceptable levels during ion treatment, while trying to balance charge control with throughput requirements for an associated ion implanter.

Figure 12:
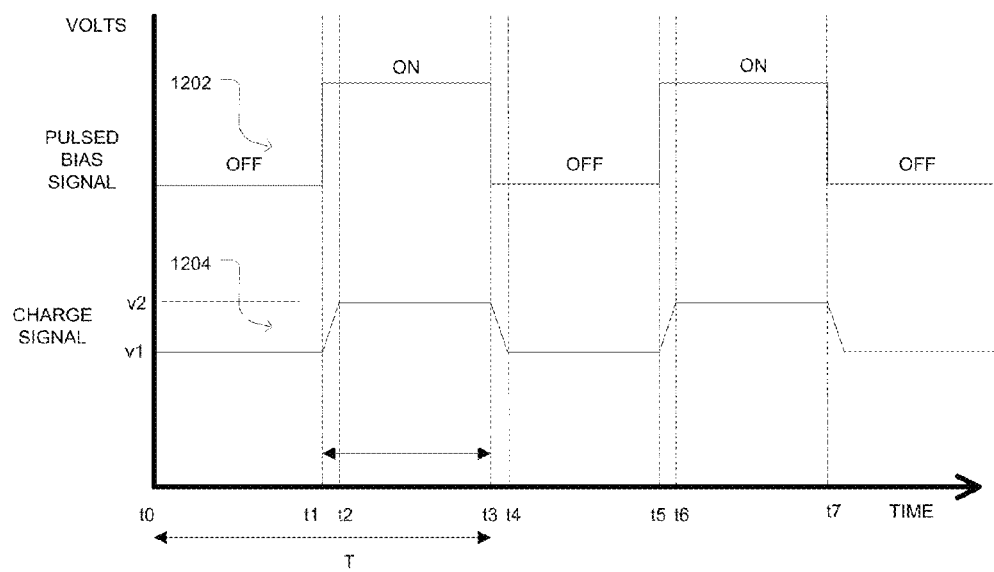
FIG. 12 is a timing diagram for the embodiment of FIG. 11.

Turning to FIG. 12, timing diagrams for the pulsed bias signal provided by the power supply 1128 and an associated charge state of the pair of semiconductors 1130, 1132 is illustrated. Plot 1202 illustrates a pulsed DC bias signal having ON and OFF time intervals with a duty cycle of about 50%. Plot 1204 illustrates a charge state of the pair of semiconductors 1130, 1132 as it varies during the pulsed to DC bias signal. In one example, the frequency of the pulsed DC bias signal may be 5 kHz for a period (T) of 200 microseconds (μs) with the ON time interval having a length of 100 μs if the duty cycle is 50%.

In operation, ions 106 are extracted into the ion beam 218 during the ON time intervals of the pulsed DC bias signal and not during the OFF time intervals. For example, ions 106 are extracted into the ion beam 218 during the first ON time interval between times (t1) and (t3) and during a second ON time interval between times (t5) and (t7). However, there is a transition period during the start of each ON time interval during which the pair of semiconductors is charged from a low level (v1) to a fully charged level (v2). This transition period is between times (t1) and (t2) for the first ON time interval and between times (t5) and (t6) for the second ON time interval. Although the change in the charge signal during the transition period is illustrated as a linear change, a non-linear change may also occur. During the transition period, the boundary 1141 between the plasma 104 and the plasma sheath 242 does not reached a desired shape as illustrated in FIG. 11 until the pair of semiconductor 1130, 1132 is fully charged to the (v2) level.

Figure 13:
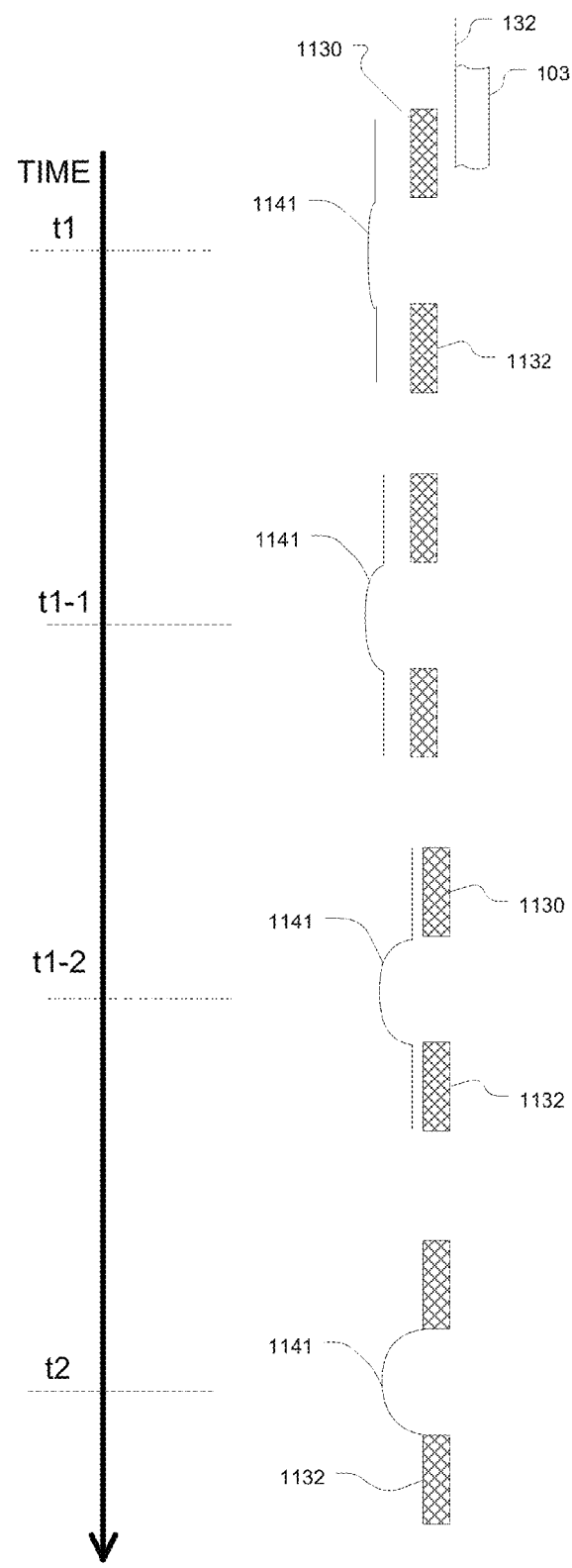
FIG. 13 is a timing diagram illustrating formation of a boundary between a plasma and plasma sheath over a transition time period of FIG. 12.

Turning to FIG. 13 in conjunction with FIG. 12, the formation of the boundary 1141 between the plasma and the plasma sheath is illustrated over one transition period at the start of the first ON time interval, e.g., between times (t1) and (t2). At time (t1), the first ON time interval begins and the pair of semiconductors 1130, 1132 begins to charge. The plasma sheath begins to form and the boundary 1141 between the plasma and the plasma sheath also begins to form. As illustrated in FIG. 13 at time (t1), the boundary 1141 is almost parallel to the plane 132 defined by the interior of the sidewall 103. Since trajectories of ions accelerated across the boundary 141 are generally at right angles to the boundary 1141, the extracted ions do not have the desired angular spread at this instance. As the pair of semiconductors 1130, 1132 begin to charge to higher levels at times (t1-1) and (t1-2), the boundary 1141 begins to move closer to an edge of the pair of semiconductors 1130, 1132 and starts to more closely resemble its desired shape as illustrated at time (t2). In other words, the shape of the boundary 1141 has a transitional shape during the transition period until it reaches its desired shaped at time (t2). Accordingly, the trajectories of ions accelerated during the transition period between times (t1) and (t2) do not reach their desired trajectories until time (t2) when the boundary 1141 reaches its desired shape. Therefore, it is generally desirable to limit the length of the transition period relative to the length of each ON time interval of the pulsed DC bias signal.

Figure 14:
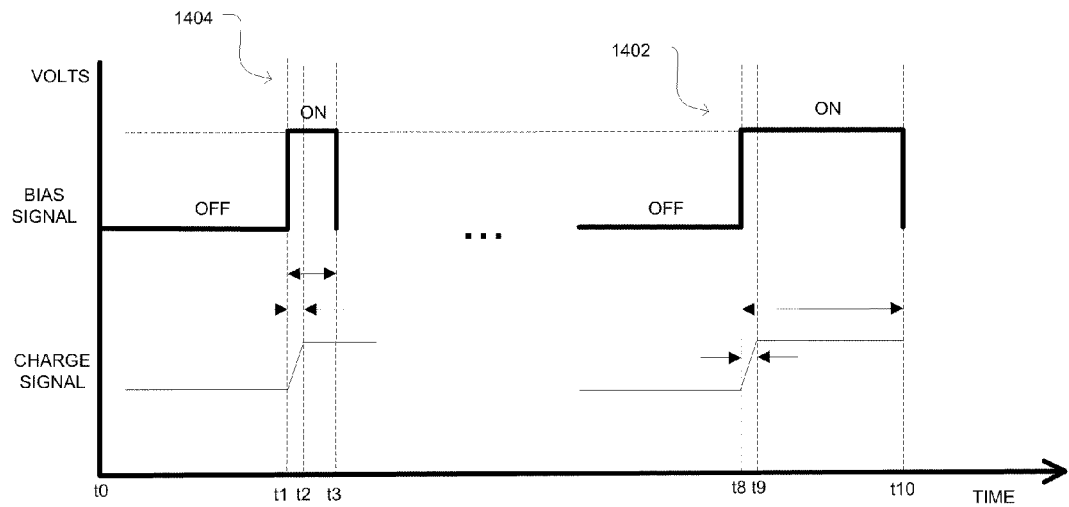
FIG. 14 is a timing diagram of a pulsed DC bias signal with different duty cycles and a charge signal for the embodiment of FIG. 11.

Turning to FIG. 14, a timing diagram illustrating the impact of the duty cycle of the pulsed DC bias signal to a ratio of the length of the transition period to an ON time interval is shown with all other parameters equal. In general, with all other parameters equal, a lower duty cycle will result in the transition period representing a larger percentage of the ON time interval. For instance, in one portion 1402 of the timing diagram, the pulsed bias signal has a duty cycle of about 50% and the length of the transition period between times (t8) and (t9) represents about 10% of the ON time interval. For example, for a 5 kHz signal at a 50% duty cycle, the ON time interval has a length of 100 μs. If the transition time interval between times (t8) and (t9) is 10 μs, then this is only 10% of the ON time interval. In contrast, the other portion 1404 of the timing diagram has a lower duty cycle of about 20% and the length of the transition period between times (t1) and (t2) is a greater percentage of the ON time interval given the same transition period length. For example, the 5 kHz signal at a 20% duty would have an ON time interval length of only 40 μs. Therefore, the same transition time of 10 μs represents a comparatively greater 25% of the ON time interval.

Figure 15:
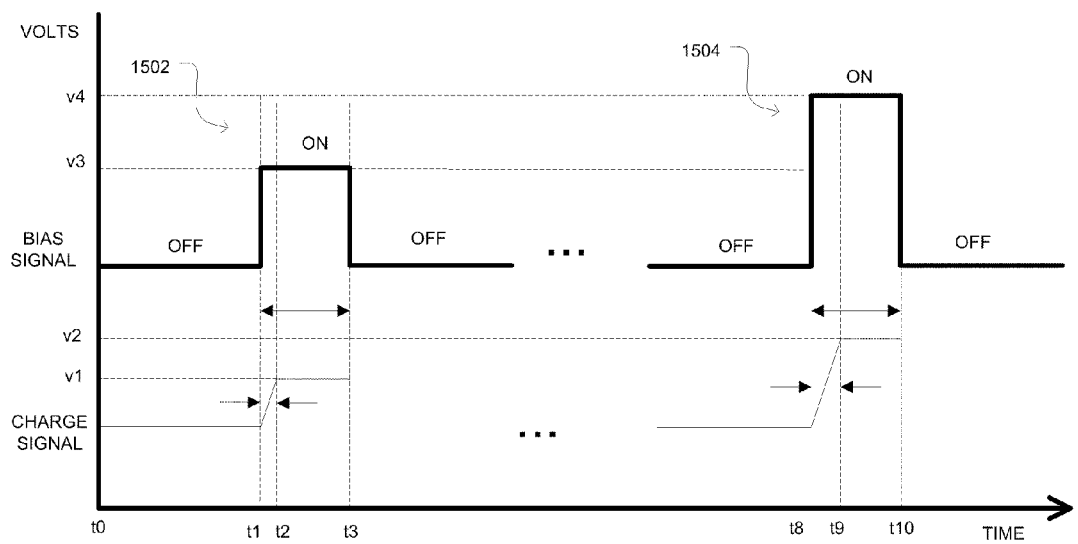
FIG. 15 is a timing diagram of a pulsed DC bias signal with different amplitudes and a charge signal with different fully charged levels for the embodiment of FIG. 11.

Turning to FIG. 15, a timing diagram illustrating the impact of the amplitude of the fully charged level for the pair of semiconductors 1130, 1132 with all other parameters equal is shown. In general, with all other parameters equal, a higher fully charged level will result in the transition period representing a larger is percentage of the ON time interval. For instance, one portion 1502 of the timing diagram illustrates a pulsed bias signal having an amplitude of (v3) volts corresponding to a fully charged level of (v1) volts for the pair of semiconductors 1130, 1132. In contrast, another portion 1504 illustrates a pulsed bias signal having an amplitude of (v4) volts, where v4>v3, corresponding to a fully charged level of (v2) volts for the pair of semiconductors, wherein v2>v1. With all other parameters being equal including the rate of increase in charge during the transition period, a larger fully charged level of (v2) volts will take longer to reach than a comparatively lower fully charged level of (v1) volts. Therefore, the second transition period between times (t8) and t(9) is longer than the first transition time period between times t(1) and t(2). Accordingly, the second transition time period [between times (t8) and t(9)] represents a larger percentage of the second ON time interval [between times t(8) and t(10)], compared to the ratio of the first transition time period [between times t(1) and t(2)] to the first ON time interval [between times t(1) and t(3)].

Given that the trajectories of the ions during the transition period at the start of the ON time interval are not ideal, it is desirable to limit a ratio of the length of the transition period to a length of an associated ON time interval to less than or equal to 15%. This can be done, in part, by selecting a type of semiconductor material that charges quickly. In general, a semiconductor whose conductivity is closer to a conductor than an insulator tends to charge up faster than a semiconductor whose conductivity is closer to an insulator. The dimensions of the semiconductor may also be selected to provide a desired length of the transition period. Once the semiconductor material is selected and placed into the ion source, the length of the transition period may still be modified in response to certain input criteria such as the duty cycle and amplitude of the pulsed bias signal. In one instance, the length of the transition period may be modified by heating the pair of semiconductors 1130, 1132. In general, a semiconductor at a higher temperature tends to have conductivity more closely resembling a conductor than an insulator and therefore tends to charge up more quickly than the same semiconductor material at a relatively lower temperature. For example, if the duty cycle is being lowered with all other parameters being equal the ratio of the length of the transition period to the ON time interval would be increased. In response, the temperature of the pair of semiconductors 1130, 1132 may be increased in order to shorter the length of the transition period to maintain the ratio of the transition period length to the ON time interval length to an acceptable level.

Yet another way to modify the length of the transition period is to increase the plasma density of the plasma 140 immediately before the start of each ON time interval which would increase the rate of charge on the semiconductors. One way to increase the plasma density is with a multi-set point RF generator for an RF type ion source. The RF antenna for the RF source may be pulsed by the multi-set point RF generator with higher power immediately before the start of each ON time interval of the pulsed bias signal. The multi-set point RF generation may also be synchronized with the pulsed bias signal.

Accordingly, there is also provided a plasma sheath modulator having a semiconductor to control a shape of a boundary between the plasma and plasma sheath proximate the extraction aperture. Compared to an insulator, the semiconductor tends to charge up faster to a fully charged level so that the desired boundary between the plasma and plasma sheath is more quickly reached.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source comprising:
an arc chamber having an extraction aperture; and
a plasma sheath modulator positioned in the arc chamber and configured to control a shape of a boundary between a plasma and a plasma sheath proximate the extraction aperture, wherein the plasma sheath modulator comprises a semiconductor.

2. The ion source of claim 1, wherein the plasma sheath modulator comprises a pair of semiconductors defining a gap there between, and wherein the shape of the boundary about the gap is a concave shape.

3. The ion source of claim 2, wherein the pair of semiconductors comprises a pair of sheets, and the extraction aperture has a slit shape.

4. The ion source of claim 2, further comprising an actuator mechanically coupled to at least one semiconductor of the pair of semiconductors to adjust a spacing of the gap.

5. The ion source of claim 2, wherein the pair of semiconductors is fabricated of doped silicon carbide.

6. The ion source of claim 2, wherein the pair of semiconductors is fabricated of silicon carbide.

7. The ion source of claim 2, further comprising a heater configured to heat the pair of semiconductors.

8. The ion source of claim 1, wherein the plasma sheath modulator is positioned in response to a desired ion beam current density of an ion beam extracted through the extraction aperture.

9. The ion source of claim 1, wherein the plasma sheath modulator is positioned in response to a desired angular spread of ions of an ion beam extracted through the extraction aperture.

10. A method comprising:
generating a plasma in an arc chamber of an ion source having an extraction aperture;
extracting ions from the plasma into an ion beam during ON time intervals of a pulsed bias signal; and
controlling a shape of a boundary between the plasma and a plasma sheath proximate the extraction aperture during the ON time intervals; and a plasma sheath modulator positioned in the arc chamber and configured to control a shape of a boundary between a plasma and a plasma sheath, wherein the plasma sheath modulator comprises a semiconductor.

11. The method of claim 10, where the controlling operation comprises creating a gap defined by a pair of semiconductors, and wherein the shape of the boundary about the gap is a concave shape.

12. The method of claim 11, further comprising charging the pair of semiconductors at the start of the ON time intervals of the pulsed bias signal, wherein the boundary between the plasma and the plasma sheath has a transitional shape during a transition period beginning at the start of the ON time intervals and ending when the pair of semiconductors reaches a fully charged level.

13. The method of claim 12, wherein the shape of the boundary between the plasma and the plasma sheath reaches a desired shape when the pair of semiconductors reaches the fully charged level.

14. The method of claim 12, wherein a ratio of a length of the transition period to a length of an associated ON time interval is less than or equal to 15%.

15. The method of claim 12, further comprising modifying a length of the transition period in response to a duty cycle of the pulsed bias signal.

16. The method of claim 15, wherein the modifying the length of the transition period comprises heating the pair of semiconductors.

17. The method of claim 12, further comprising modifying a length of the transition period in response to an amplitude of the pulsed bias signal.

18. The method of claim 12, wherein the pair of semiconductors is fabricated of doped silicon carbide.

19. The method of claim 12, wherein the pair of semiconductors is fabricated of silicon carbide.

* * * * *